(12) United States Patent
Hasegawa et al.

(10) Patent No.: US 6,507,035 B1
(45) Date of Patent: Jan. 14, 2003

(54) PHOTOCOUPLER DEVICE, METHOD FOR FABRICATING THE SAME, AND LEAD FRAME FOR PHOTOCOUPLER DEVICE

(75) Inventors: Yasushi Hasegawa, Nara-ken (JP); Hideya Takakura, Nara-ken (JP); Kazuo Kusuda, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/482,278

(22) Filed: Jan. 13, 2000

(30) Foreign Application Priority Data

Jan. 13, 1999 (JP) .......................... 11-007067
Feb. 22, 1999 (JP) .......................... 11-043785

(51) Int. Cl.⁷ .............................................. G02B 27/00
(52) U.S. Cl. ........................................ 250/551; 257/80
(58) Field of Search ................ 250/551, 239; 257/80–84, 434, 666–677, 692–697; 438/111, 112, 24–26

(56) References Cited

U.S. PATENT DOCUMENTS 4,933,729 A * 6/1990 Soejima et al. ............... 257/82
5,753,929 A * 5/1998 Bliss .......................... 250/551
5,770,867 A   6/1998 Sata et al. ..................... 257/81

FOREIGN PATENT DOCUMENTS

| EP | 632 509 A2 | 1/1995 |
| EP | 727 825 A2 | 8/1996 |
| JP | 63073678 | 4/1988 |
| JP | 01161780 | 6/1989 |
| JP | 06005905 | 1/1994 |
| JP | 10-209488 | 7/1998 |

* cited by examiner

Primary Examiner—Que T. Le
Assistant Examiner—Thanh X. Luu
(74) Attorney, Agent, or Firm—Birch, Stewart, Kolasch & Birch, LLP

(57) ABSTRACT

A photocoupler device includes a light emitting element; a monitor photodetector and an output photodetector for receiving light from the light emitting element; a primary side lead frame for mounting the light emitting element and the monitor photodetector; and a secondary side lead frame for mounting the output photodetector, wherein the light emitting element and the output photodetector are placed so as to face each other.

11 Claims, 16 Drawing Sheets

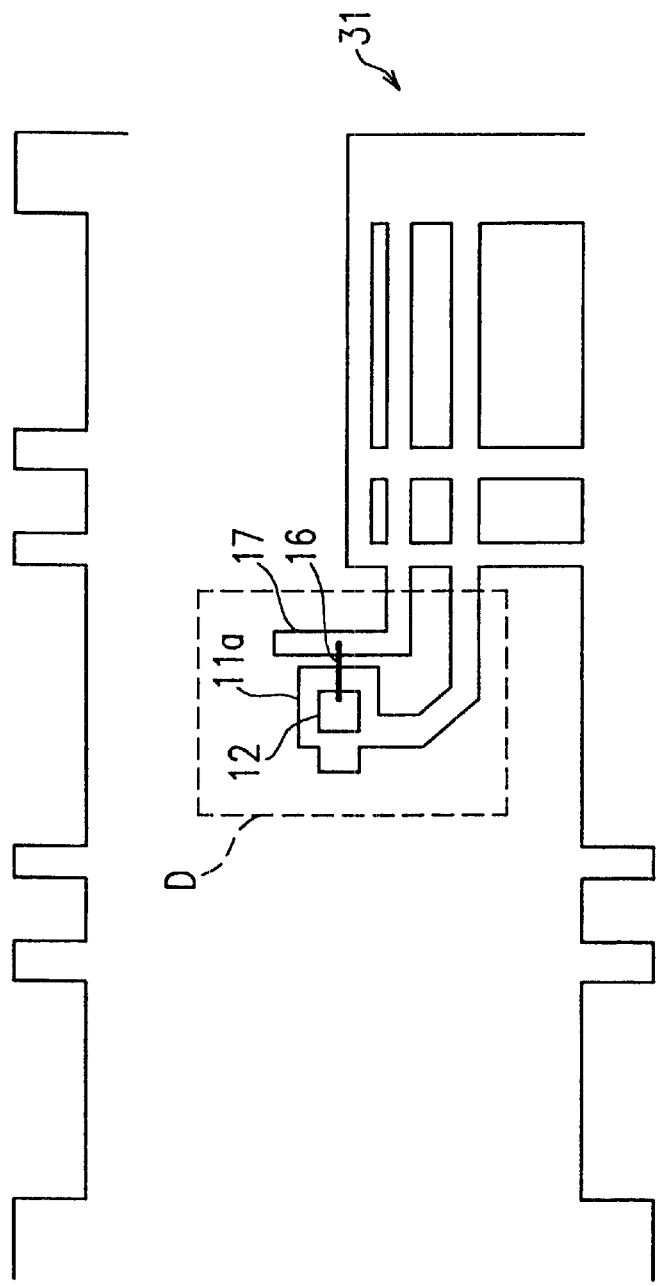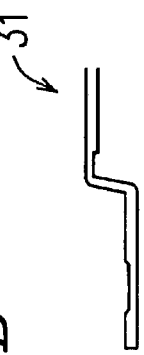

PHOTOCOUPLER DEVICE, METHOD FOR FABRICATING THE SAME, AND LEAD FRAME FOR PHOTOCOUPLER DEVICE

BACKGROUND OF THE INVENTION

1. Field of the Invention

The present invention relates to a photocoupler device integrally including a light emitting element, and an output photodetector and a monitor photodetector for receiving light emitted by the light emitting element. The present invention also relates to a fabrication method thereof.

In another aspect, the present invention relates to a lead frame for the photocoupler device.

2. Description of the Related Art

In a photocoupler device, an optical signal is transmitted from a light emitting element on a primary side to a photodetector on a secondary side while the primary side and the secondary side are electrically isolated from each other. The light emitting element and the photodetector are mounted on a lead frame, an optical path therebetween is made of a light-transmissive resin, and the optical path is covered with a light-shielding resin.

In recent years, a photocoupler device including two photodetectors, one for signal transmission and the other for monitoring, has been proposed. Specifically, an extra photodetector is provided on the primary side in order to monitor an emission output level of the light emitting element, and to feed the monitoring result back to the light emitting element. This solves the problem of nonlinearity in temperature characteristics, etc., which is specific to light emitting elements, thereby stabilizing the emission output level.

FIG. 10 is a plan view showing one example of the conventional photocoupler device. FIG. 11 is a cross-sectional view of the photocoupler device shown in FIG. 10. As shown in FIGS. 10 and 11, a light emitting element 101 is mounted on a primary side lead frame 102a via an electrically conductive paste or the like, and connected to a lead frame 103 for connecting a line by an Au wire 104 or the like. An output photodetector 105 is mounted on a secondary side lead frame 102b, and is connected to a lead frame 106 for connecting a line by an Au wire 104 or the like. A photodetector 107 for monitoring (hereinafter, referred to as "monitor photodetector 107") is mounted on the primary side lead frame 102a in the same manner as the light emitting element 101, and connected to a lead frame 108 for connecting a line by the Au wire 104 or the like.

The light emitting element 101, the output photodetector 105, and the monitor photodetector 107 are placed on the same plane, and are covered with a light-transmissive resin layer 109 which is made of a transmissive potting resin such as a silicone resin. Additionally, the resultant structure is covered with a molded layer 110 made of a light-shielding resin such as an epoxy resin, in order to reflect an optical signal from the light emitting element 101 and/or block interfering stray light from outside.

FIG. 12 is a schematic circuit diagram of the photocoupler device including the light emitting element 101, the output photodetector 105, and the monitor photodetector 107, which are electrically isolated from one another. Between the light emitting element 101 and the photodetector 105, and between the light emitting element 101 and the photo-detector 107, only optical signals are transmitted.

In such a structure, upon receiving an electric signal through the lead frame 103 for connecting a line, the light emitting element 101 photoelectrically converts the electric signal to an optical signal, and emits the optical signal. The optical signal travels through the light-transmissive resin layer 109 and is reflected by the interface between the light-transmissive resin layer 109 and the molded layer 110. The reflected optical signal reaches the output photodetector 105 and the monitor photodetector 107. The output photodetector 105 converts the optical signal to an electric signal, and outputs the electric signal. Likewise, the monitor photodetector 107 converts the optical signal to an electric signal, and outputs the electric signal. The electric signal from the monitor photodetector 107 is fed back in order to control an emitting operation of the light emitting element 101.

Next, prior art directed to a lead frame for a photocoupler device is described.

FIG. 17 is a circuit diagram showing a configuration example of a high-linearity analogue photocoupler device (hereinafter, simply referred to as a "linear photocoupler"). Although not shown, two devices are required for the substitution of pulse transes. Thus, a majority of linear photocoupler devices include two channels of devices in one package.

A typical linear photocoupler includes a light emitting element (LED) 202 and a monitor output element (photodiode) 203 on a primary side, and an output element (photodiode) 204 on a secondary side. In the case where a current flowing through the light emitting element 202 on the primary side is represented by IF, and photoelectric currents flowing through the monitor output element 203 and the output element 204 are represented by IPD1 and IPD2, respectively, the relationships between IF, IPD1 and IPD2 are as follows:

$$IPD1 = IF \times K1, \quad IPD2 = IF \times K2.$$

If K3=K2/K1, IPD2=IPD1×K3. It is desirable that K3 is as close to 1 as possible. "K3=1" is most desirable for facilitating the design of the peripheral circuits. That is, it is required to adjust the photoelectric currents flowing through the monitor output element 203 and the output element 204 to the same or substantially identical value (i.e., it is required that the elements 203 and 204 receives light from the light emitting element 202 at the same level). Furthermore, electrical insulation between the primary and secondary sides are required, which is an essential characteristic of the photocoupler device.

As described above, a typical photocoupler includes the light emitting element 202, the monitor photodetector 203, which is used for stabilizing the emission of the light emitting element 202, on the primary side and the output photodetector 204 on the secondary side. In such a device, it is required that the same level of light from the light emitting element 202 is incident on each of the two photodetectors 203 and 204, and that the primary side and the secondary side are electrically isolated from each other.

Hereinafter, an exemplary structure of the conventional linear photocoupler and an exemplary fabrication method thereof will be described with reference to FIGS. 18A, and 18B, 19, and 20.

Referring to FIGS. 18A (plan view) and 18B (cross-sectional view), a light emitting element 202, a monitor output photodetector 203, and an output photodetector 204 are die-bonded (adhered) onto a flat lead frame 201. After the elements are connected to the outer leads by gold wires 205, the elements are covered with a transparent silicone resin 206 or the like, and then transfer-molded with an epoxy resin 207.

FIG. 19 (an example of the structure of the lead frames) and FIG. 20 (a cross sectional view of an example of a photocoupler) show another example. In this example, lead frames 201 and 201' are used. A tip of the lead frame 201 is raised upward and provided with only the light emitting element 202 adhered and mounted thereon, while a tip of the lead frame 201' is lowered and provided with a photodetector 203 for monitoring and a photodetector 204 for output adhered and mounted thereon. Each element is wire bonded to the outer leads, respectively, as shown in the drawings. The light emitting element 202 is precoated with a transparent silicone resin 208 for relieving the stress thereof, and then positioned over the photodetector 203 for monitoring and the photodetector for output 204 so as to face the photodetectors 203 and 204.

Thereafter, the first transfer molding process is performed with a light-transmissive epoxy resin 209 and, in addition, the second transfer molding process is performed with a light-shielding epoxy resin 210, resulting in the structure shown in FIG. 20.

For the photocoupler device, the ratio of the output level between the monitor photodetector and the output photodetector, and the stability thereof are essential characteristics. Thus, various ideas and considerable efforts has been directed to the formation of the light-transmissive resin layer, i.e., the optical path which affects the ratio of output level between the photodetectors. For example, by adjusting the position of the light emitting element and/or the photodetectors with respect to the lead frame, or by utilizing a tension of the Au wire or the like electrically connecting each of the light emitting element and/or the photodetectors to the lead frame, the shape of the light-transmissive resin layer can be stabilized. Alternatively, by employing a silicone resin having high viscosity as a light-transmissive resin, the shape of the light-transmissive resin layer can be stabilized.

However, in the conventional photocoupler device, a light emitting element, a photodetector for output, and a photodetector for monitoring are placed on the same plane. In such a design, these elements consume a large area, and thus a great amount of silicone resin is required in order to cover the entire elements. Accordingly, using the silicone resin for the performance improvement of the photocoupler device leads to an increase of cost because the silicone resin is expensive.

Furthermore, as described above, the shape of the light-transmissive resin layer is stabilized by using a surface tension of the silicone resin caused by the shape of the Au wire or the like connecting the elements to the lead frame. Thus, when an unstable assembly and fabrication process causes the shape of the Au wire or the like to vary so as to change the surface tension of the silicone resin, the light-transmissive resin layer are deformed, and accordingly, the ratio in the output level between the photodetector for monitoring and the photodetector for output varies.

Moreover, since the light-transmissive resin layer and the molded layer provided thereon have different coefficients of thermal expansion, the state of the interface therebetween is unstable against temperature variation, and the state of reflection on the interface is also unstable. Thus, temperature variation changes the transmission efficiency of optical signals between the light emitting element and each of the photodetectors. Consequently, reliability of the feed back control based on the output from the photodetector for monitoring is degraded.

In a conventional photocoupler device, since the optical signal travels by using reflection, a white resin with less fillers has been typically used for the outer molded layer. Accordingly, the photocoupler device is likely to be affected by interfering stray light from outside, and thus has less reliability.

In the prior art described above with reference to FIGS. 18A and 18B, which is directed to the photocoupler device and the lead frame for photocoupler device, all of the three elements (i.e., the light emitting element 202, the monitor output element 203, and the output element 204) are required to be entirely covered with the silicone resin 206. In such a technique, it is very difficult to adjust the amount of resin, and to stabilize the shape of applied resin. Furthermore, when the amount and/or the shape of the silicone resin 206 is not uniform, it is impossible to transmit the same quantity of light to the monitor output element 203 and the output element 204. As a result, a difference in the amount of photoelectric current between the monitor output element 203 and the output element 204 becomes large. Therefore, the difference between K1 and K2 described above becomes large.

Furthermore, in this structure, characteristics of the element are likely to vary due to the temperature fluctuation around the element (caused by reflow, soldering, etc.). Specifically, because of heat in the interface between the silicone resin 206 covering the elements 202, 203, and 204 and the epoxy resin 207, the silicone resin 206 and the epoxy resin 207 are peeled off from or adhered to each other at the interface therebetween. This affects the reflection of light from the light emitting element 202, and therefore causes light-transmission efficiency from the element 202 to the monitor output element 203 and the output element 204 to be varied. In addition, the withstand voltage between the primary and secondary sides is inferior to that of the dual-transfer type photocoupler shown in FIGS. 19 and 20.

On the other hand, the prior art described above referring to FIGS. 19 and 20 is free from such problems. However, since the two lead frames 201 and 201' are combined into a laminate, as shown in FIG. 21, leads protruding from the primary and secondary side lead frames of the package are not present on the same plane.

Furthermore, as shown in FIG. 21, a tie bar portion 211 is superposed on another tie bar portion 211'. Such unnecessary portions (shaded portions) of the tie bar 211 are cut off by a metal mold after being covered with light-shielding epoxy resin 210. In order to cut off the shaded portions, more pressure is required as compared with the case where single tie bar (having ½ the thickness of the shaded portion) is cut off. As a result, a greater impact is given to the elements and, in the worst case, causes the deformation of the leads, or cracks in the package. In addition, portions 211A of the tie bar 211 are not cut away and therefore remain on the leads. These remainders may be left in the mold unless manually removed. This may cause troubles such as breakage of the mold. When the remainders are manually removed, productivity significantly decreases.

As described hereinabove, the conventional photocoupler device bears various complicated problems as to characteristics, structure, and productivity thereof. In order to address such problems, it has been required to devise a photocoupler having a novel structure.

SUMMARY OF THE INVENTION

According to one aspect of the present invention, a photocoupler device includes a light emitting element; a monitor photodetector and an output photodetector for receiving light from the light emitting element; a primary side lead frame for mounting the light emitting element and the monitor photodetector; and a secondary side lead frame for mounting the output photodetector, wherein the light emitting element and the output photodetector are placed so as to face each other.

In one embodiment of the present invention, the monitor photodetector on the primary side lead frame and the output photodetector on the secondary side lead frame are provided on a same plane, and are positioned so as to face the light emitting element on the primary side lead frame.

In another embodiment of the present invention, the monitor photodetector and the light emitting element on the primary side lead frame are provided on a same plane, and are positioned so as to face the output photodetector on the secondary side lead frame.

In still another embodiment of the present invention, the monitor photodetector and the light emitting element of the primary side lead frame are positioned at different levels, and face the output photodetector on the secondary side lead frame.

In still another embodiment of the present invention, the light emitting element, the monitor photodetector, and the output photodetector are covered with a light-transmissive resin through a first transfer molding process, and then, are further covered with a light-shielding resin through a second transfer molding process.

In still another embodiment of the present invention, the light emitting element and the monitor photodetector, or the light emitting element and the output photodetector are covered with a single transparent resin layer.

In still another embodiment of the present invention, at least one of the light emitting element, the monitor photodetector, and the output photodetector is precoated with a transparent resin layer.

According to another aspect of the present invention, a method for fabricating a photocoupler device including a light emitting element, and a monitor photodetector and an output photodetector for receiving light from the light emitting element includes steps of: mounting the light emitting element on a first lead frame; mounting the output photodetector and the monitor photodetector on a second lead frame; and combining the first lead frame and the second lead frame so that the light emitting element and the monitor photodetector are provided on a primary side, and the output photodetector is provided on a secondary side.

According to still another aspect of the present invention, a lead frame for a photocoupler device includes a primary side lead frame and a secondary side lead frame, wherein the primary side lead frame and the secondary side lead frame are combined together, and have a common reference plane, wherein the primary and secondary side lead frames each have a plurality of turned-up portions extending upward with respect to the reference plane, and a plurality of turned-down portions extending downward with respect to the reference plane, and one of the turned-up portions does not extend over any other turned-up portion, and one of the turned-down portions does not extend below any other turned-down portion.

In one embodiment of the present invention, element-pairs of a light emitting element and a monitor output element, and output elements are provided one after another on each of the primary and secondary side lead frames; and the primary and secondary side lead frames are assembled so that one of the element-pairs provided on the primary side lead frame faces a corresponding one of the output elements provided on the secondary side lead frame, and one of the element-pairs provided on the secondary side lead frame faces a corresponding one of the output elements provided on the primary side lead frame.

According to still another aspect of the present invention, a photocoupler device includes a light emitting element; a monitor output element; an output element; and a primary side lead frame and a secondary side lead frame having a common reference plane, wherein the primary and secondary side lead frames each have a plurality of element mounting portions for alternately mounting the light emitting element, the monitor output element, and the output element, wherein some of the plurality of element mounting portions extend upward and others extend downward with respect to the reference plane, and wherein one of the element mounting portions extending upward does not extend over any other element mounting portion extending upward, and one of the element mounting portions extending downward does not extend below any other element mounting portion extending downward, and the primary and secondary side lead frames are assembled so that one of pairs of the light emitting element and the monitor output element provided on the primary side lead frame faces corresponding one of the output elements provided on the secondary side lead frame, and one of pairs of the light emitting element and the monitor output element provided on the secondary side lead frame faces corresponding one of the output elements provided on the primary side lead frame.

In the present invention having the above-described structure, as typically shown in FIGS. 1 and 2, upon receiving an electric signal via the lead frame 17 for connecting a line, the light emitting element 12 photoelectrically converts the electric signal to an optical signal, and outputs the optical signal. The optical signal travels through the light-transmissive resin 22 and reaches the output photodetector 15 and the monitor photodetector 13. The output photodetector 15 converts the optical signal to an electric signal, and outputs the electric signal via the lead frame 19 for connecting a line. Likewise, the monitor photodetector 13 converts the optical signal to an electric signal, and outputs the electric signal via the lead frame 18 for connecting a line. The electric signal from the monitor photodetector 13 is fed back in order to control the output operation of the light emitting element 12. Since the light emitting element 12 is placed so as to face the monitor photodetector 13 and the output photodetector 15, both of the optical paths between the light emitting element 12 and the photodetector 13, and between the light emitting element 12 and the photodetector 15 are linear.

Furthermore, in the lead frame according to the present invention having the above-described structure, as shown in FIGS. 13A, 13B, 14A, 14B, and 15, the primary and secondary side lead frames 231 and 232 are combined into a laminate, and have the same reference plane when they are combined. The lead frames 231 and 232 are provided with element mounting portions 212–217 and 218–223, respectively, and turned-up or turned-down with respect to the reference plane. One of the element mounting portions extending upward does not extend over any other element mounting portion extending upward, and one of the element mounting portions extending downward does not extend below any other element mounting portion extending downward. On the element mounting portions of each of the primary and secondary side lead frames, a light emitting element 202, a monitor output element 203 and an output element 204 are placed in alternate order. When the primary and secondary side lead frames are combined, an element pair including the light emitting element and the monitor output element on the primary side faces the output element on the secondary side, and an element pair including the light emitting element and the monitor output element on the secondary side faces the output element on the primary side.

Hereinafter, functions of the present invention will be described.

According to a photocoupler device of the present invention, a light emitting element and an output photodetector are placed so as to be face each other. Thus, an optical path between the light emitting element and the output photodetector becomes linear, whereby light emitted by the light emitting element is directly incident on the output photodetector. As a result, effects of the optical path on the optical signals are small. Furthermore, the optical path is linear and short, and expensive silicone resin is not required for the formation of the optical path. Even if the silicone resin is used, a paltry amount of silicone resin is sufficient. Additionally, since the optical signal travels without using reflection, the optical signal is not likely to be affected by the external shape of the optical path. As a result, an output ratio between the monitor photodetector and the output photodetector becomes stable. Furthermore, a transmission efficiency of the optical signal between the light emitting element and the photodetector does not vary even when the state of the reflection surface is varied due to the temperature variation because the optical signal travels without using reflection. Furthermore, for the same reason, a light-shielding resin, e.g., a resin of black color, can be applied to the outermost surface of the photocoupler device, whereby interfering stray light from outside is surely blocked. As a result, reliability of the photocoupler device can be increased.

Furthermore, according to a method for fabricating a photocoupler device of the present invention, only a light emitting element is mounted on the primary side lead frame, while the monitor photodetector and the output photodetector are mounted on the secondary side lead frame. The lead frames are combined so as to provide a light emitting element and a monitor photodetector on the primary side and the output photodetector on the secondary side. In such a structure, in each lead frame, the light emitting element and respective photodetectors can be separately assembled. If assemblies of the elements are concurrently conducted, the fabrication process is simplified. After the lead frames are combined, the light emitting element and the monitor photodetector belong to the primary side, while the output photodetector belongs to the secondary side. This arrangement causes no problem in practical use.

Thus, the invention described herein makes possible the advantages of (1) providing a photocoupler device with a stable output ratio between photodetectors and a high reliability, and a fabrication method of the photocoupler device, and (2) providing a lead frame with a simple structure, superior characteristics, and improved productivity, and a photocoupler device using the same.

These and other advantages of the present invention will become apparent to those skilled in the art upon reading and understanding the following detailed description with reference to the accompanying figures.

BRIEF DESCRIPTION OF THE DRAWINGS

FIGS. 4A and 4B show a plan view and a cross-sectional view of a first lead frame, respectively.

DESCRIPTION OF THE PREFERRED EMBODIMENTS

Hereinafter, an embodiment of the present invention will be described with reference to the attached drawings.

Figure 1:
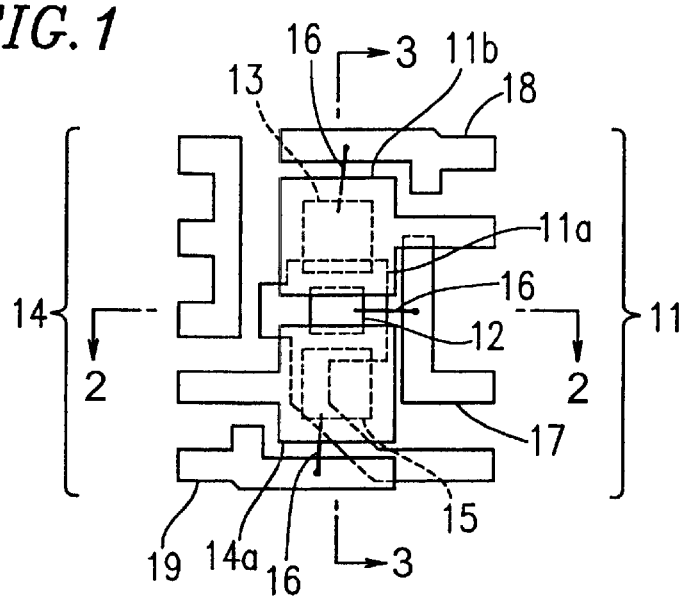
FIG. 1 is a plan view showing one embodiment of a photocoupler device according to the present invention.
Figure 2:
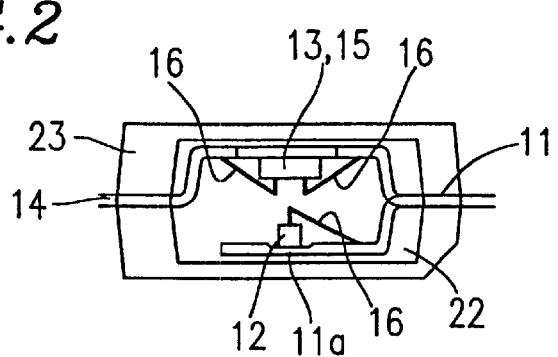
FIG. 2 is a cross-sectional view of the photocoupler device taken along line 2—2, of FIG. 1.
Figure 3:
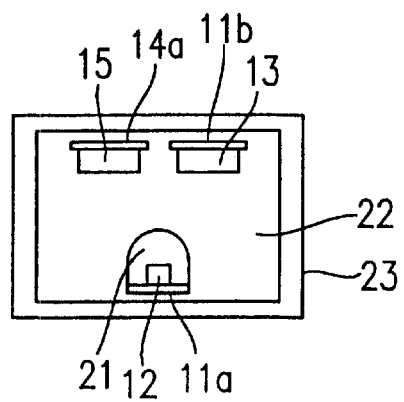
FIG. 3 is a cross-sectional view of the photocoupler device taken along line 3—3 of FIG. 1.

FIG. 1 is a plan view showing a photocoupler device according to one embodiment of the present invention. FIGS. 2 and 3 show cross-sectional views of the photocoupler device taken along line A–A' and line B–B' of FIG. 1, respectively.

In the photocoupler device according to the present invention, a light emitting element 12 and a photodetector for monitoring 13 (hereinafter, referred to as "monitor photodetector 13") are mounted on headers 11a and 11b of a primary side lead frame 11, respectively; a photodetector for outputting 15 (hereinafter, referred to as "output photodetector 15") is mounted on a header 14a of a secondary side lead frame 14. The header 11b and the header 14a are on the same plane, and the header 11a is on a different level. The light emitting element 12 is placed so as to face both of the monitor photodetector 13 and the output photodetector 15.

The light emitting element 12 is connected to a lead frame 17 for connecting a line by an Au wire 16 or the like. The monitor photodetector 13 is connected to a lead frame 18 for connecting a line by an Au wire 16 or the like. The output photodetector 15 is connected to a lead frame 19 for connecting a line by an Au wire 16 or the like.

As shown in FIG. 3, the light emitting element 12 is precoated with a transparent silicone resin 21. The light emitting element 12, the monitor photodetector 13, and the output photodetector 15 are covered with a light-transmissive resin layer 22. The light-transmissive resin layer 22 is covered with a light-shielding resin layer 23.

Figure 12:
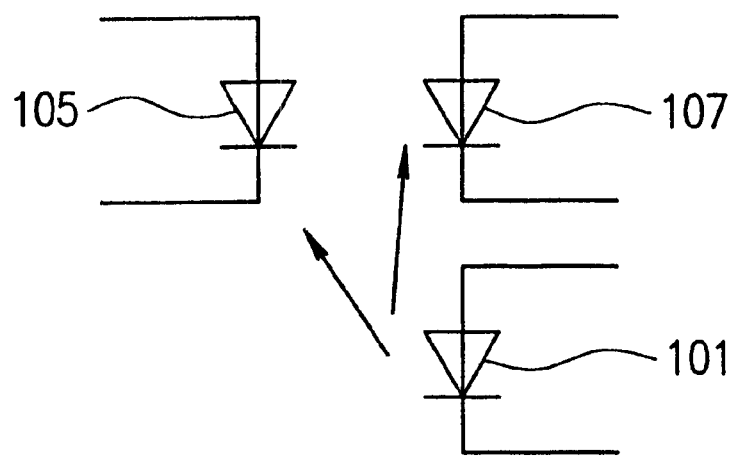
FIG. 12 is a circuit configuration of the conventional photocoupler device shown in FIG. 10.

The photocoupler device according to the present embodiment has a circuit configuration similar to that shown in FIG. 12. As shown in FIG. 12, the light emitting element 12, the monitor photodetector 13, and the output photodetector 15 are electrically isolated from one another. Only optical signals are transmitted among the elements 12, 13, and 15.

In such a structure, as shown in FIGS. 1 and 2, upon receiving an electric signal via the lead frame 17 for connecting a line, the light emitting element 12 photoelectrically converts the electric signal to an optical signal, and outputs the optical signal. The optical signal travels through the light-transmissive resin layer 22 and reaches the output photodetector 15 and the monitor photodetector 13. The output photodetector 15 converts the optical signal to an electric signal, and outputs the electric signal via the lead frame 19 for connecting a line. Likewise, the monitor photodetector 13 converts the optical signal to an electric signal, and outputs the electric signal via the lead frame 18 for connecting a line. The electric signal from the monitor photodetector 13 is fed back in order to control an output operation of the light emitting element 12.

As shown in FIG. 3, the light emitting element 12 is placed so as to face the monitor photodetector 13 and the output photodetector 15, and is positioned in a position opposite to an area intermediate to the photodetectors 13 and 15. Thus, the level of the signal received by the photodetector 13 and the level of the signal received by the photodetector 15 are substantially the same. Accordingly, the output levels from the photodetectors 13 and 15 are also substantially the same.

Optical paths between the light emitting element 12 and the monitor photodetector 13 and between the light emitting element 12 and the output photodetector 15 both are linear. Thus, even if the shape of the light-transmissive resin layer 22 is different from a prescribed design or is deformed from its original shape, an output ratio between the monitor photodetector 13 and the output photodetector 15 does not change. Furthermore, since it is not necessary to strictly define the shape and size of the light-transmissive resin layer 22, it is not required to use an expensive silicone resin for the light-transmissive resin layer 22 in order to stabilize the shape thereof. This avoids the increase in cost. Alternatively, even when the silicone resin is used, amount of the silicone resin to be used is reduced by limiting the area to which the silicone resin is applied to small areas between the light emitting element 12 and the monitor photodetector 13 and between the light emitting element 12 and the output photodetector 15. This suppresses the increase in cost.

Furthermore, unlike the conventional art, the present embodiment does not utilize the reflection of optical signals at an interface between a light-transmissive resin layer 22 and a light-shielding resin layer 23. Thus, even if the state of the interface between the resin layers 22 and 23 is varied due to temperature variation, transmission efficiencies between the light emitting element 12 and the monitor photodetector 13 and between the light emitting element 12 and the output photodetector 15 do not vary. Accordingly, the output ratio between the monitor photodetector 13 and the output photodetector 15 does not change. As a result, feedback control based on the output of the monitor photodetector 13 can be effectively performed.

Furthermore, since the present embodiment does not utilize the reflection of optical signals at an interface between a light-transmissive resin layer 22 and a light-shielding resin layer 23, a light-shielding resin which is of, e.g., a black color, can be used as the light-shielding resin layer 23. The light-shielding resin layer 23 blocks substantially all interfering stray light from outside. Accordingly, reliability of the photocoupler device can be increased.

Next, a method for fabricating the photocoupler device according to this embodiment of the present invention is described.

Figure 5A:
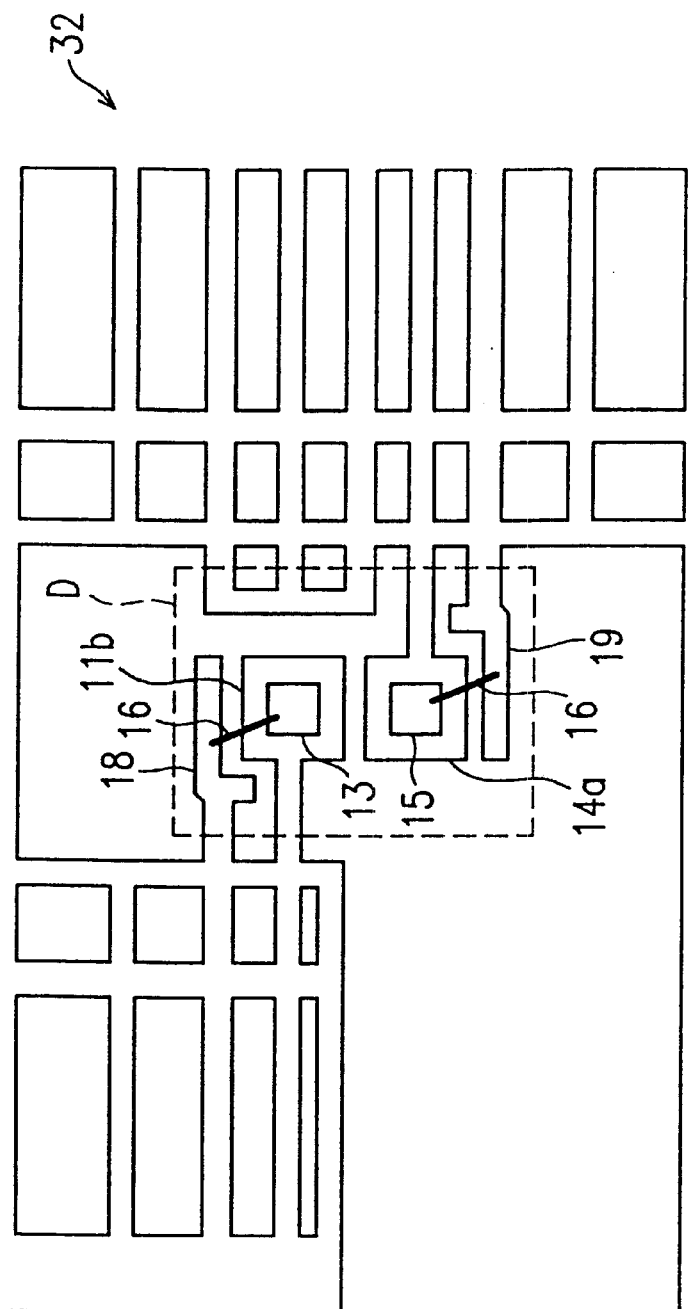
FIGS. 5A and 5B show a plan view and a cross-sectional view of a second lead frame, respectively.
Figure 5B:
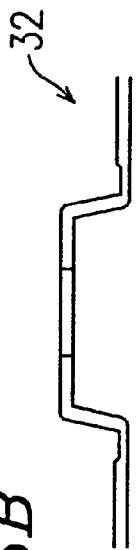

FIGS. 4A and 4B shows a plan view and a cross-sectional view of a first lead frame 31, respectively. FIGS. 5A and 5B shows a plan view and a cross-sectional view of a second lead frame 32, respectively.

The first lead frame 31 has the header 11a for mounting the light emitting element 12, the lead frame 17 for connection with the light emitting element 12, and the like. After the assembly of the entire lead frame structure has been completed, the first lead frame 31 functions as a part of the primary side lead frame 11 as shown in FIG. 1.

In the first lead frame 31, the light emitting element 12 is adhered on the header 11a via an Ag paste and the like, and on the other hand is connected to the lead frame 17 for connecting a line by a bonding wire such as an Au wire 16 or the like. Thereafter, a precoating with a silicone resin layer 21 (not shown) is applied to the light emitting element 12.

The second lead frame 32 has the headers 11b and 14a, the lead frames 18 and 19 for connecting the photodetectors 13 and 15. After the assembly of the entire lead frame structure has been completed, the second lead frame 32 functions as the primary side lead frame 11 and the secondary side lead frame 14 as shown in FIG. 1.

In the second lead frame 32, the monitor photodetectors 13 and the output photodetector 15 are adhered on the headers 11b and 14a, respectively, via an Ag paste and the like, and on the other hand respectively are connected to the lead frames 18 and 19 for connecting a line by a bonding wire such as an Au wire 16.

In the present embodiment, as described above, the process of mounting and wiring the light emitting element 12 onto the first lead frame 31 is performed independent of the process of mounting and wiring the photodetectors 13 and 15 onto the second lead frame 32. Thus, these processes can be concurrently performed, and therefore can be simplified. On the other hand, for example, when a light emitting element and a photodetector facing thereto are mounted and wired on the same lead frame, the fabrication process becomes complicated because a face of the lead frame on which the light emitting element is mounted, is opposite to a face on which the photodetector is mounted.

Figure 6:
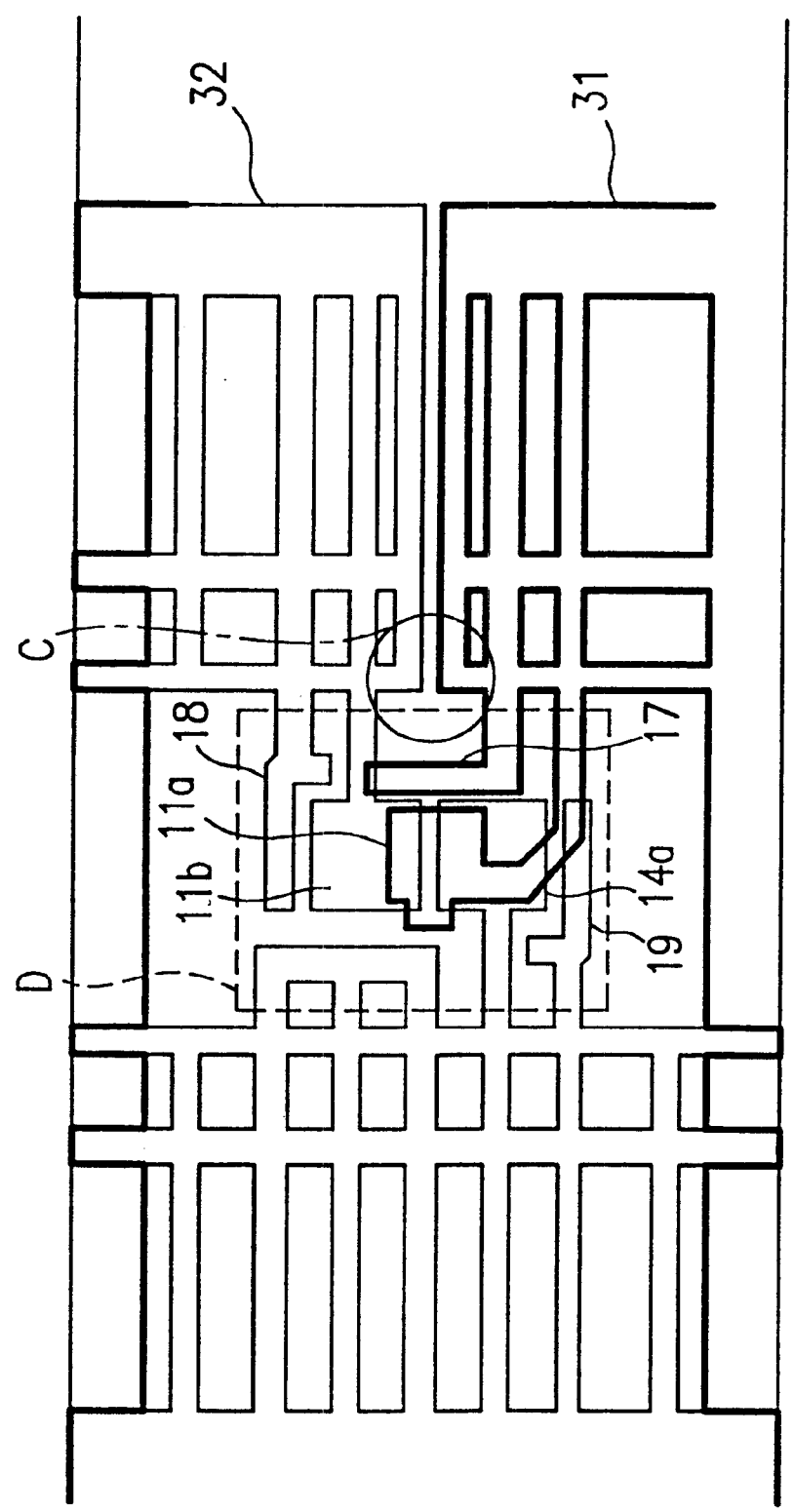
FIG. 6 is a plan view showing the first and second lead frames combined with each other.

After the light emitting element 12, and the monitor photodetector 13 and the output photodetector 15 have been mounted and wired, the second lead frame 32 is turned upside down so that the right side is replaced by the left side, and superposed on the first lead frame 31, as shown in FIG. 6. In FIG. 6, the first lead frame 31 is depicted with thick lines, and the second lead frame 32 is depicted with thin lines.

Figure 7:
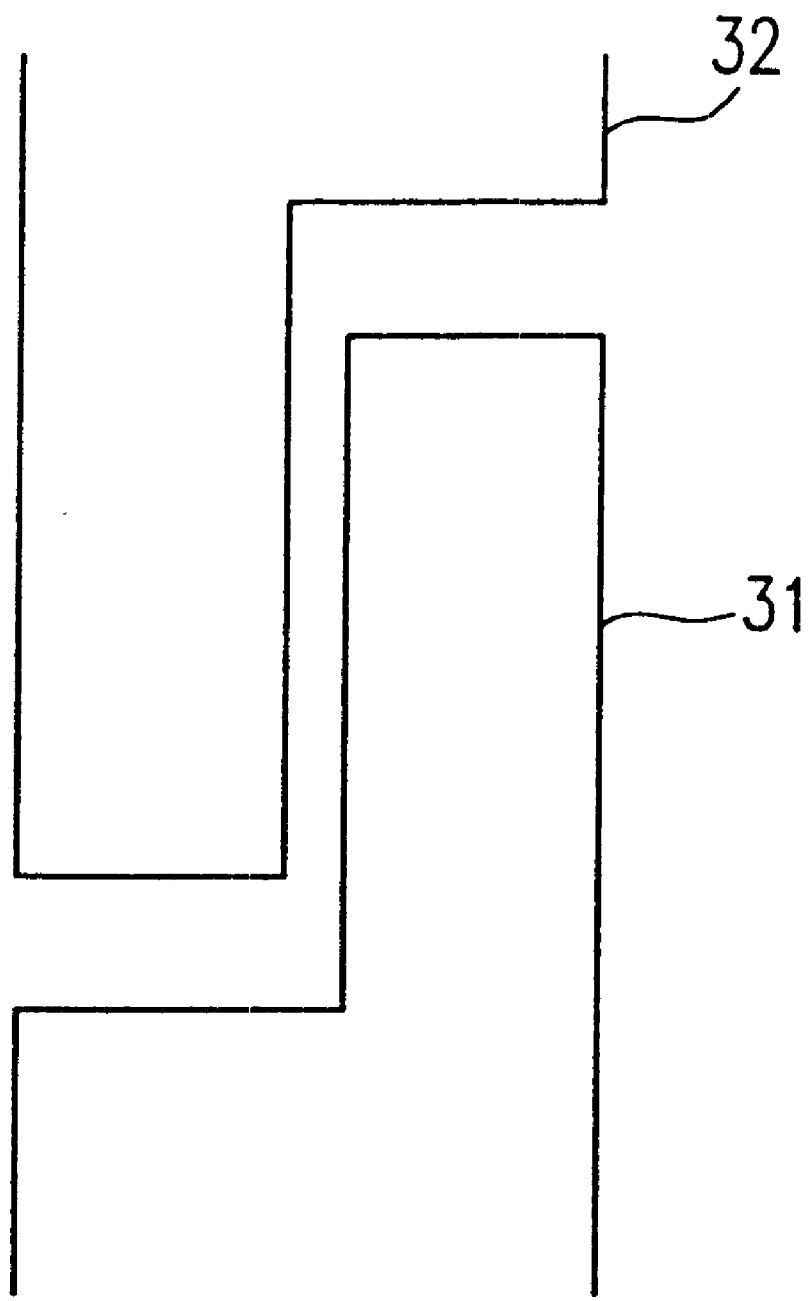
FIG. 7 is an enlarged plan view showing another combination of the first and second lead frames.

Thereafter, a light-transmissive resin layer 22 is formed by a first transfer molding so as to cover the light emitting element 12, the monitor photodetectors 13, and the output photodetector 15 (first transfer molding process). Furthermore, a light-shielding resin layer 23 is formed by a second transfer molding so as to cover the light-transmissive resin layer 22 (second transfer molding process). With the above structure, the molding resin leaks out from a portion C (FIG. 6) on the primary side between the first and second lead frames 31 and 32 during the molding processes. According to the present embodiment, a pair of fitting portions, e.g., a concavity and a convexity, are provided on each of the portions of upper and lower metal molds corresponding to the portion C in order to squash the portion C between the first and second lead frames 31 and 32, thereby preventing the resin from leaking out therefrom. Additionally, by designing the portion C between the first and second lead frames 31 and 32 in the shape of a dogleg as shown in FIG. 7, leaking resin can be suppressed more effectively.

Thus, by covering the elements 12, 13, and 15 with the resin layers through the first and second transfer molding processes in the above-described manner, each of the elements are provided with sufficient protection and therefore the reliability thereof improves.

After the molding processes, a portion D (FIG. 6) of the first and second lead frames 31 and 32 is carved out to form the primary side lead frame 11 and the secondary side lead frame 14 as shown in FIG. 1, obtaining a photocoupler device. As clearly seen in FIGS. 1 and 6, when the first lead frame 31 and the second lead frame 32 are combined, the primary side lead frame 11 is provided with the light emitting element 12 and the monitor photodetector 13, while the secondary side lead frame 14 is provided with the output photodetector 15.

FIGS. 8A–8E show variations of the photocoupler device according to the present invention.

In FIGS. 8A–8E, the light emitting element 12 and the monitor photodetector 13 on the primary side lead frame 11 are provided on the same plane. The output photodetector 15 on the secondary side lead frame 14 faces the light emitting element 12.

With such a structure, the shape of the first and second lead frames can be simplified. On the other hand, however, the output photodetector 15 directly receives an optical signal from the light emitting element 12, while the monitor photodetector 13 mainly receives light reflected by the interface between the light-transmissive resin layer 22 and the light-shielding resin layer 23, causing a difference between the output level of the photodetector 15 and the output level of the photodetector 13. However, in the usual case, a circuit constant (e.g., resistance value) of a circuit downstream from the photocoupler device for processing the outputs from the monitor photodetector 13 and the output photodetector 15 can be adjusted so that the difference between the output levels is eliminated.

The variations shown in FIGS. 8A–8E can be subjected to the first and second transfer molding processes. Therefore, reliability of each variation of the photocoupler device improves.

Figure 8A:
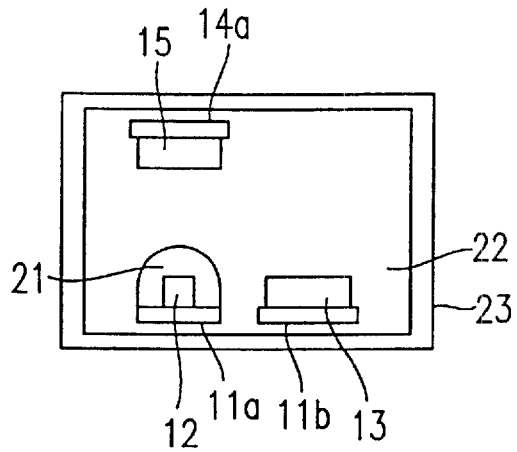
FIGS. 8A–8E are cross-sectional views each showing a variation of a photocoupler device according to the present invention.
Figure 8B:
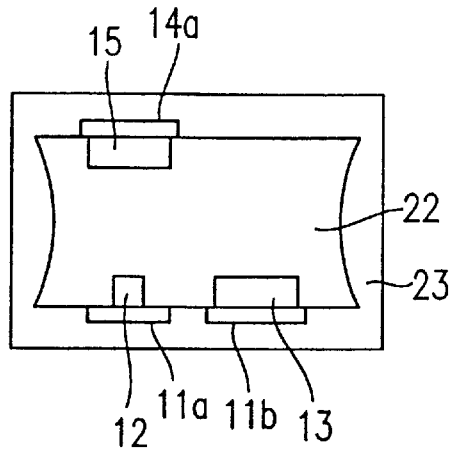
Figure 8C:
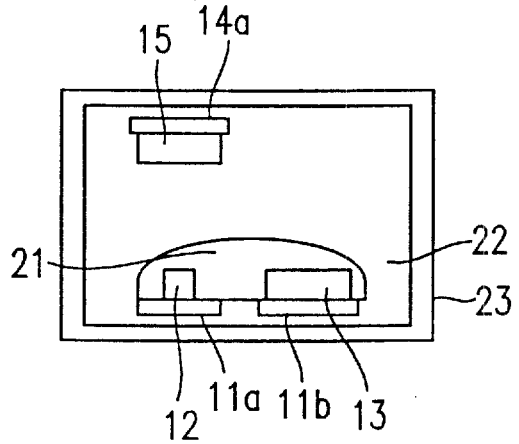
Figure 8D:
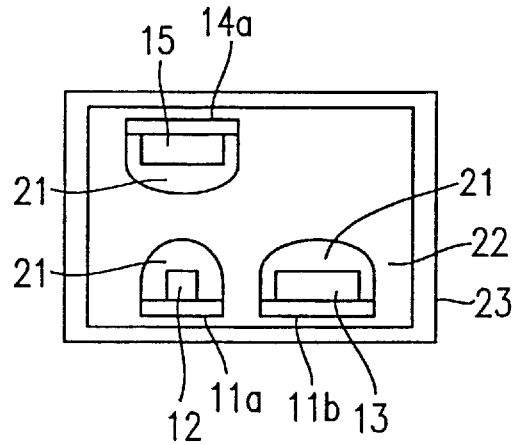

Furthermore, by precoating each of the photodetectors 13 and 15 with the silicone resin layer 21 as well as the light emitting element 12 as shown in FIG. 8D, the transmission efficiency in each of the optical paths from the light emitting element 12 to the photodetectors 13 and 15 improves. Consequently, the output level from each of the photodetectors 13 and 15 is enhanced. That is, the transparency of the silicone resin layer 21 can be set to be higher than that of the light-transmissive resin layer 22 which is provided through the transfer molding process, whereby the transparency of some portions in the optical paths improves. As a result, transmission efficiency in each of the optical paths is increased, and the output level of each of the photodetectors 13 and 15 enhances.

Figure 8E:
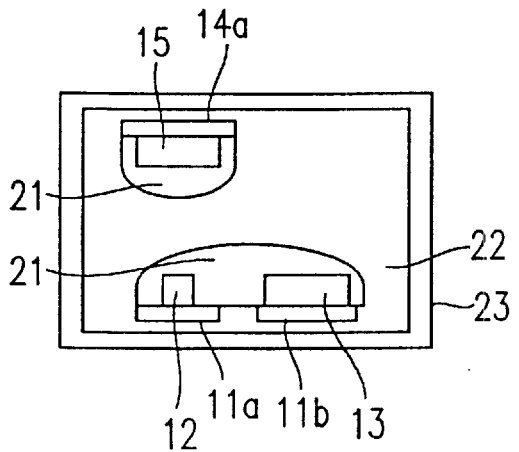

Furthermore, by covering the light emitting element 12 and the monitor photodetector 13 with a single silicone resin layer 21 having a high transparency as shown in FIGS. 8C and 8E, a transmission efficiency in the optical path from the light emitting element 12 to the monitor photodetector 13 improves. Consequently, the output level of the monitor photodetector 13 is enhanced.

Alternatively, the light emitting element 12 and the output photodetector 15 may be covered with a single silicone resin layer 21, thereby enhancing the output level from the output photodetector 15.

Figure 9A:
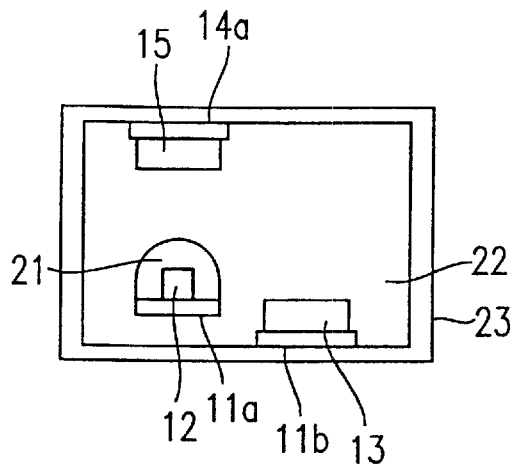
FIGS. 9A–9C are cross-sectional views each showing another variation of a photocoupler device according to the present invention.
Figure 9B:
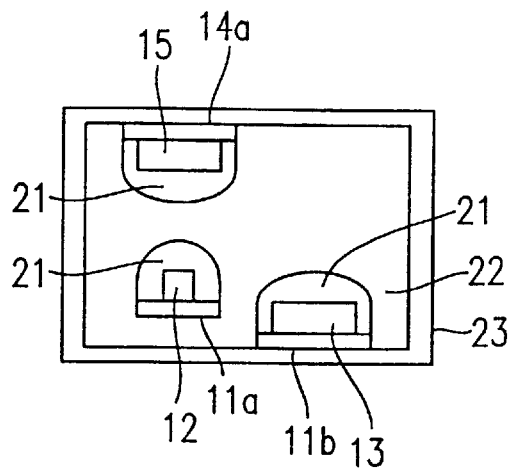
Figure 9C:
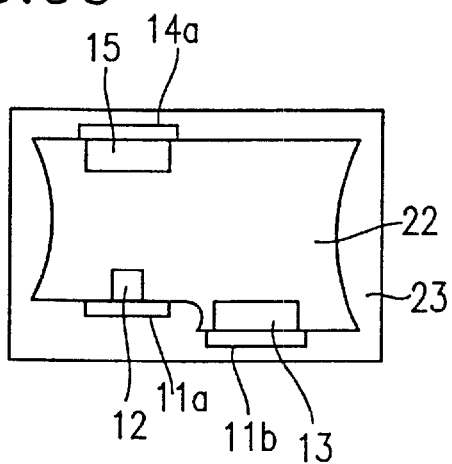
Figure 10:
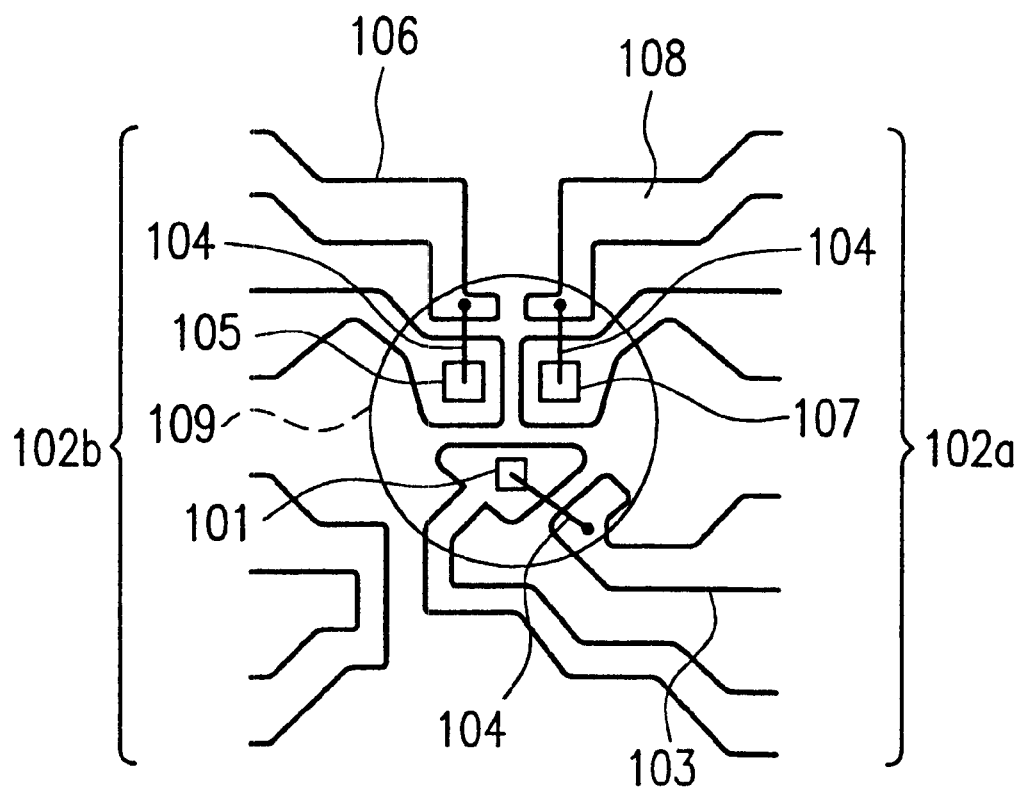
FIG. 10 is a plan view showing one example of the conventional photocoupler device.
Figure 11:
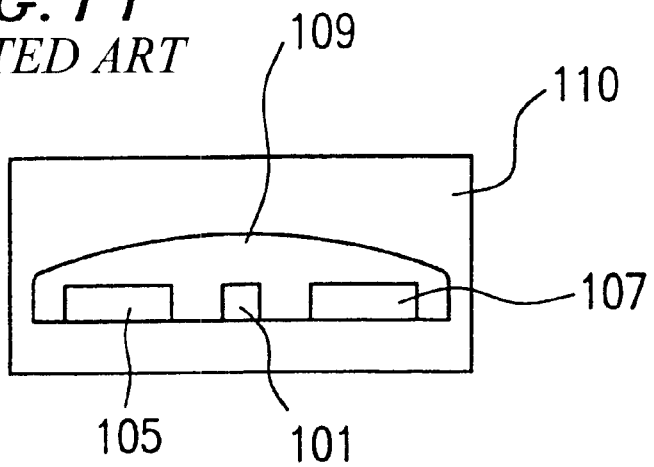
FIG. 11 is a schematic front view of the conventional photocoupler device shown in FIG. 10.

FIGS. 9A–9C show another group of variations of the photocoupler device according to the present embodiment.

In FIGS. 9A–9C, the light emitting element 12 and the monitor photodetector 13 of the primary side lead frame 11 are positioned at different levels, i.e., the monitor photodetector 13 is positioned at the lower level than the light emitting element 12. In addition, the light emitting element 12 is placed so as to face the output photodetector 15 of the secondary side lead frame 14.

In such a structure, a horizontally traveling component of light emitted by the light emitting element 12 is effectively transmitted to the monitor photodetector 13. As a result, the output level of the monitor photodetector 13 enhances.

Furthermore, by precoating each of the photodetectors 13 and 15 with the silicone resin layers 21, respectively, as well as the light emitting element 12 as shown in FIG. 9B, the transmission efficiency in each of the optical paths from the light emitting element 12 to the photodetectors 13 and 15 improves. Consequently, the output level from each of the photodetectors 13 and 15 is enhanced.

Hereinafter, a lead frame for use in the photocoupler device according to the present invention will be described.

The present invention provides lead frames wherein each of the primary and secondary side lead frames both have turned-up portions and turned-down portions for mounting light emitting elements and photodetectors. In such a structure, the light emitting elements and the photodetectors are provided so that light emitted by the light emitting element is incident directly on the photodetectors. Thus, variation in optical characteristics such as light-transmission efficiency does not occur. Furthermore, the present invention also provides a lead frame wherein unnecessary tie bar portions are not left on the leads when the lead frames are combined. The present invention further provides a photocoupler device using the lead frame. The photocoupler device of the present invention exhibits higher performance and reliability as compared with the conventional linear photocoupler. In addition, the photocoupler device of the present invention can be fabricated in a stable manner.

The term "reference plane" of the lead frame used herein refers to a face of the substrate on which elements are provided.

Figure 13A:
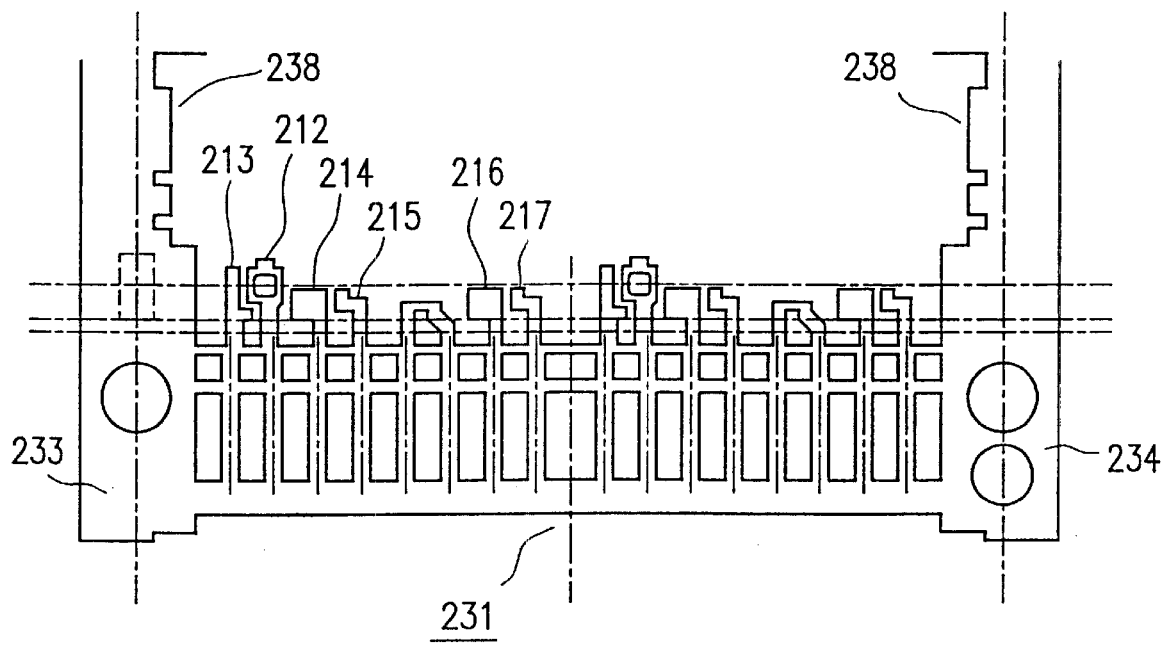
FIGS. 13A and 13B shows a plan view and a front view of a primary side lead frame, respectively.
Figure 13B:
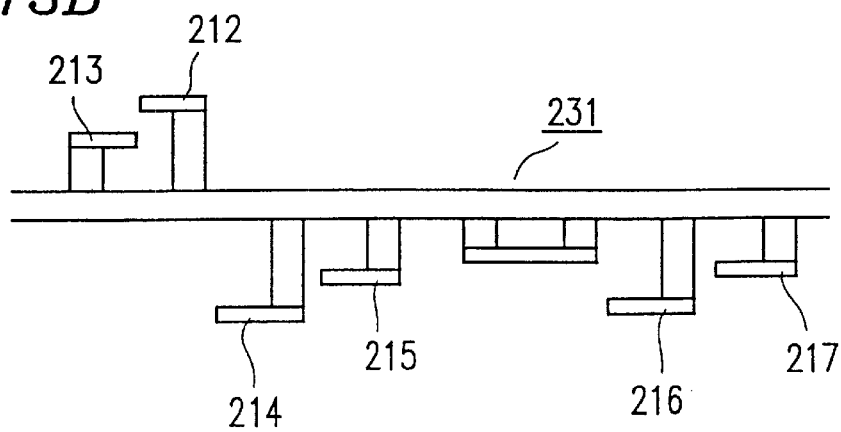
Figure 14A:
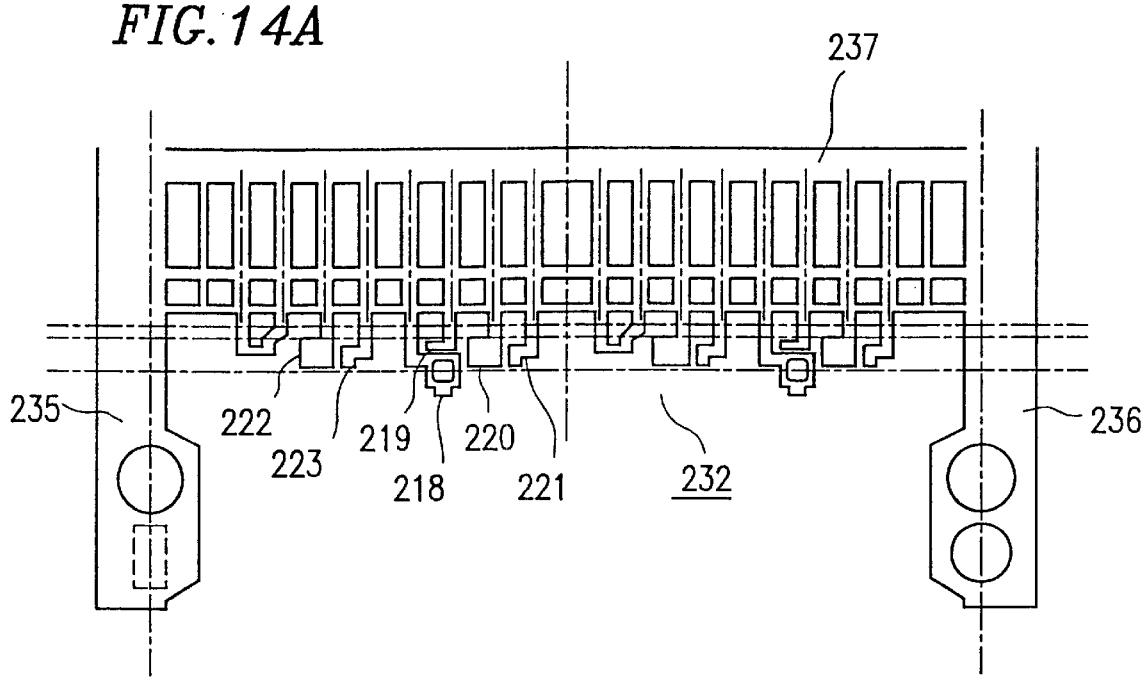
FIGS. 14A and 14B shows a plan view and a front view of a secondary side lead frame, respectively.
Figure 14B:
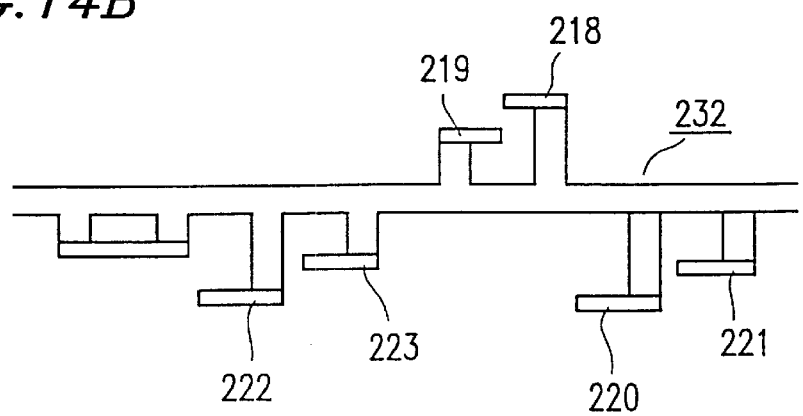

FIGS. 13A and 13B shows a plan view and a front view of a primary side lead frame, respectively. FIGS. 14A and 14B shows a plan view and a front view of a secondary side lead frame, respectively. In this example, a lead frame which can be used for a dual-channel type linear photocoupler is employed.

A primary side lead frame 231 has cradles 233 and 234, and a secondary side lead frame 232 has cradles 235 and 236 in both sides thereof, respectively, on which the lead frames 231 and 232 are supported. These cradles facilitate the handling of the lead frames 231 and 232. On each of the lead frames 231 and 232, element-pairs of a light emitting element 202 (not shown) and a monitor output element 203 (not shown), and output elements 204 (not shown) are provided in alternate order. The primary side and secondary side lead frames 231 and 232 each have pulled-up portions and pulled-down portions for mounting a light emitting element 202, a monitor output element 203, and an output elements 204. The pulled-up portions and pulled-down portions are formed so that the element-pair of the light emitting element 202 and the monitor output element 203 and the output elements 204 face each other when the primary side and secondary side lead frames 231 and 232 are combined. Specifically, an element-pair of a light emitting element 202 and a monitor output element 203 of the primary side faces a corresponding output element 204 of the secondary side, and a pair of a light emitting element 202 and a monitor output element 203 of the secondary side faces corresponding output element 204 of the primary side.

Referring to FIG. 13B, in the primary side lead frame 231, a header 212 and a terminal 213 of the primary side for mounting the light emitting element 202 are turned upward, in order to mount the light emitting element 202 on the back surface of the lead frame. A header 214 and a terminal 215 for mounting the monitor output element 203, a header 216 and a terminal 217 for mounting the output element 204 are turned downward, in order to mount the monitor output element 203 and the output element 204 on the front surface of the lead frame. In this example, two sets of these elements and terminals are formed between the cradles 233 and 234 of the primary side lead frame 231.

As shown in FIGS. 14A and 14B, leads of the secondary side lead frame 232 extend in a direction opposite to the direction to which the leads of the primary side lead frame 231 extend. A header 218 and a terminal 219 for mounting the light emitting element 202 are turned upward, in order to mount the light emitting element 202 on the back surface of the lead frame. A header 220 and a terminal 221 for mounting the monitor output element 203, a header 222 and a terminal 223 for mounting the output element 204 are turned downward, in order to mount the monitor output element 203 and the output element 204 on the front surface of the lead frame. In this example, two sets of these elements and terminals are formed between the cradles 235 and 236 of the secondary side lead frame 232.

Figure 15:
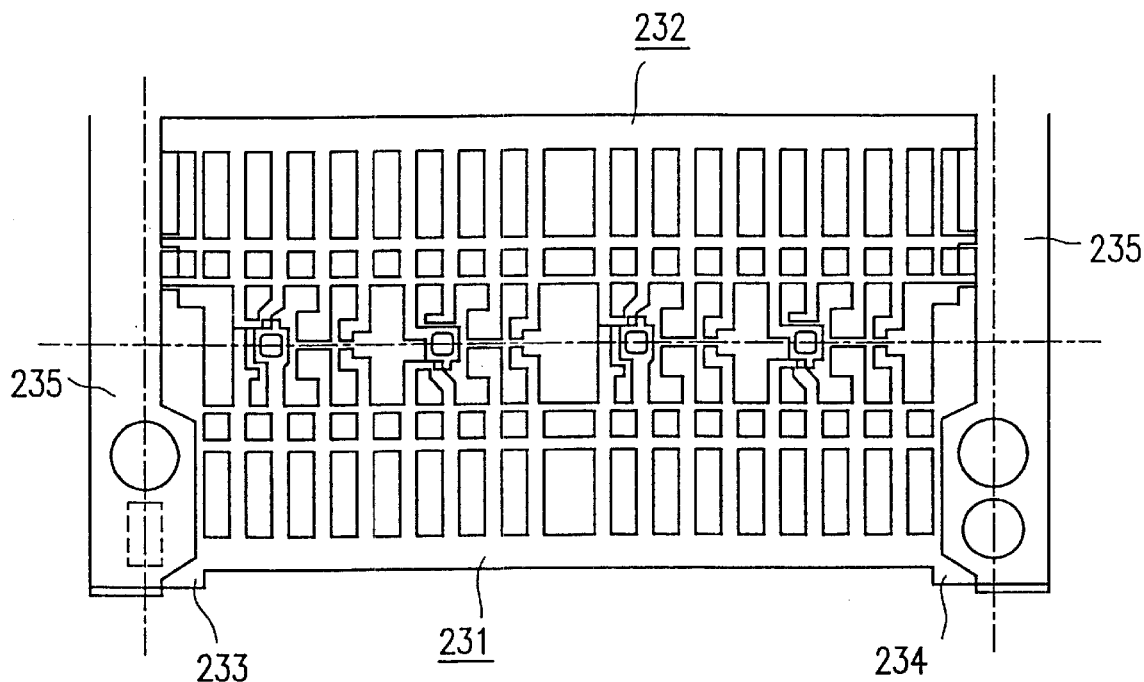
FIG. 15 is a plan view showing the primary and secondary side lead frames combined with each other.

FIG. 15 shows the primary side lead frame 231 and the secondary side lead frame 232 when they are combined. The cradles 233 and 234 of the primary side lead frame 231 has notches 238 (shown in FIG. 13A) for engaging with a tie bar 237 (shown in FIG. 14A), or the like, of the secondary side lead frame 232 so that the primary side lead frame 231 is accurately positioned with respect to the secondary side lead frame 232 when combined with the secondary side lead frame 232. Furthermore, prior to combining the lead frames, the secondary side lead frame 232 is bent downward along the horizontal direction of FIG. 14A so that the primary and secondary side lead frames 231 and 232 have the same reference plane when they are combined into a laminate. (See FIGS. 13A, 13B, 14A, and 14B).

Figure 16:
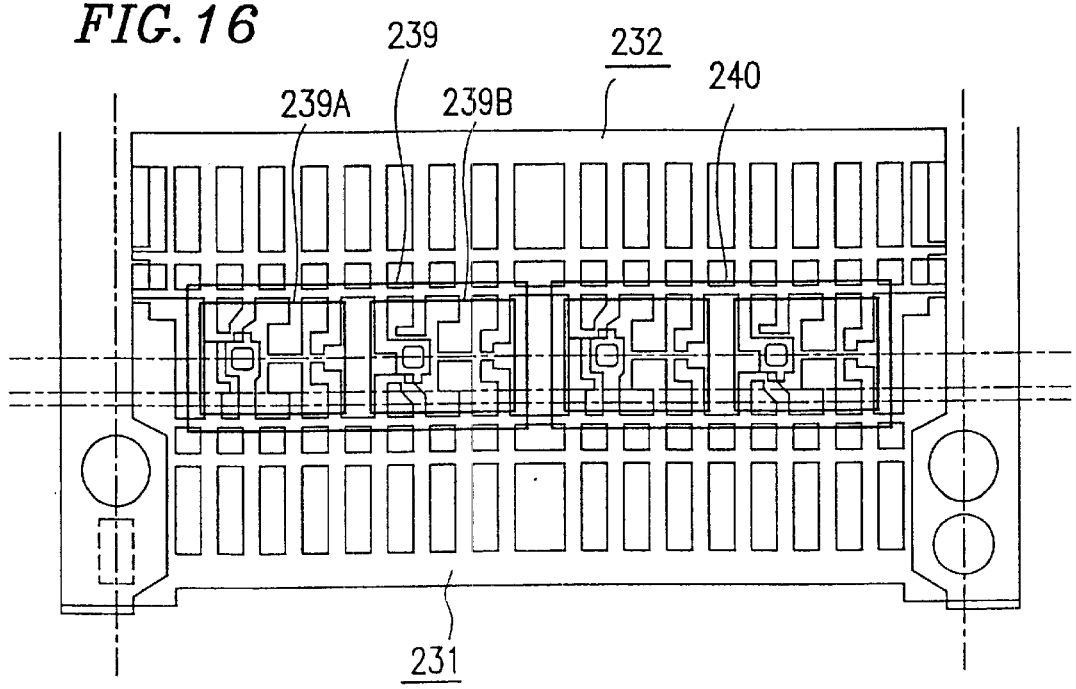
FIG. 16 is a plan view showing an example of a structure of a photocoupler.
Figure 17:
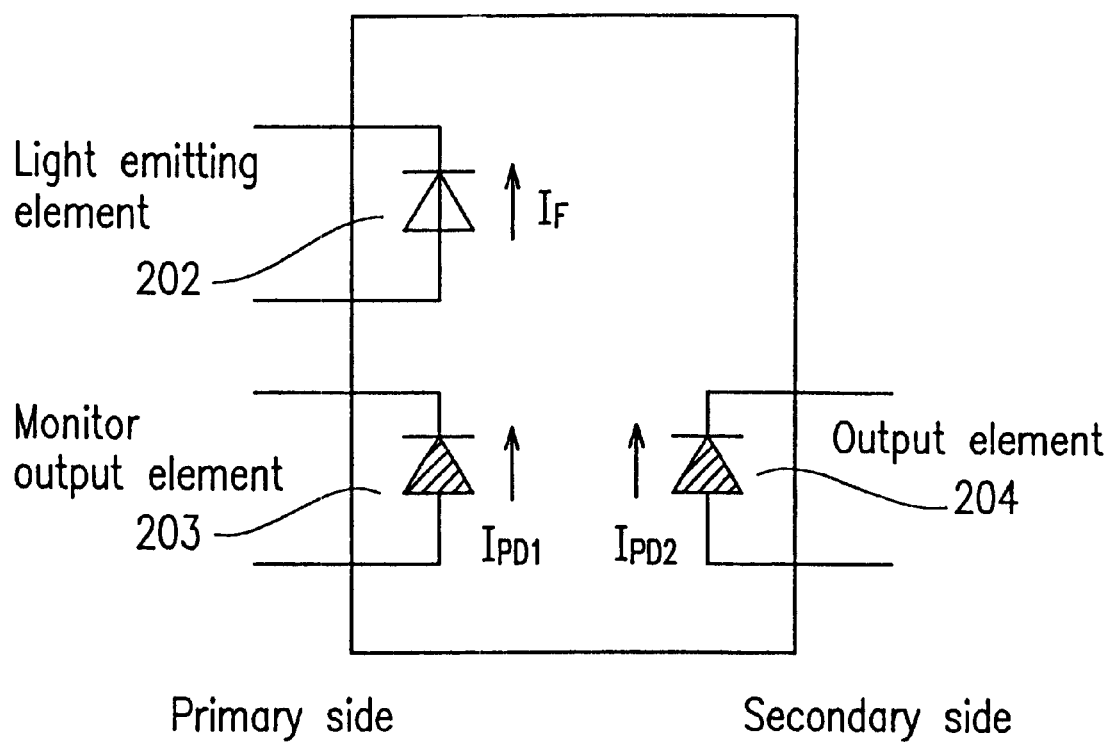
FIG. 17 shows an exemplary circuit configuration of a linear photocoupler.
Figure 18A:
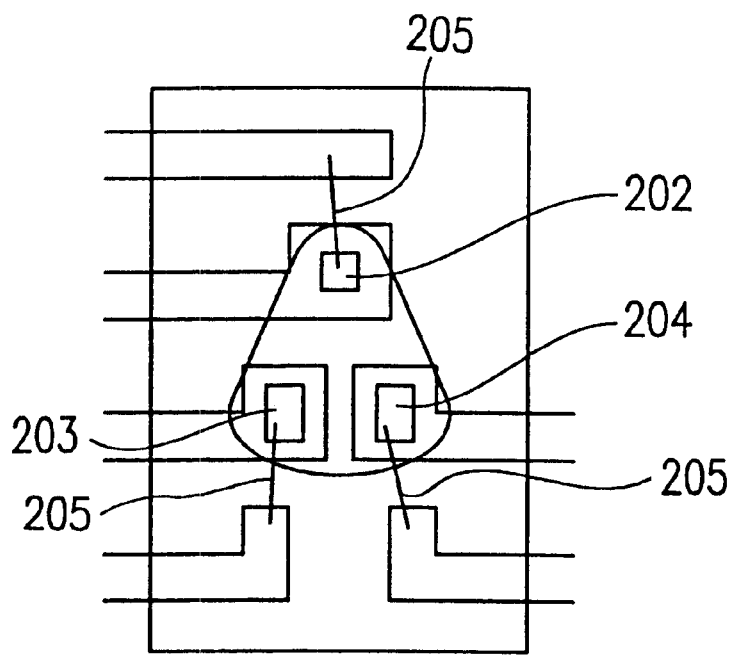
FIGS. 18A and 18B show a structure example of the conventional linear photocoupler.
Figure 18B:
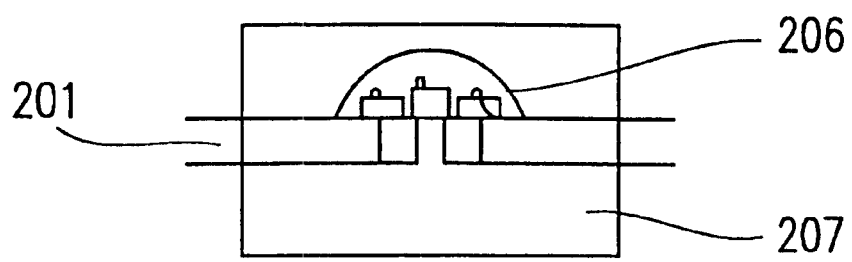
Figure 19:
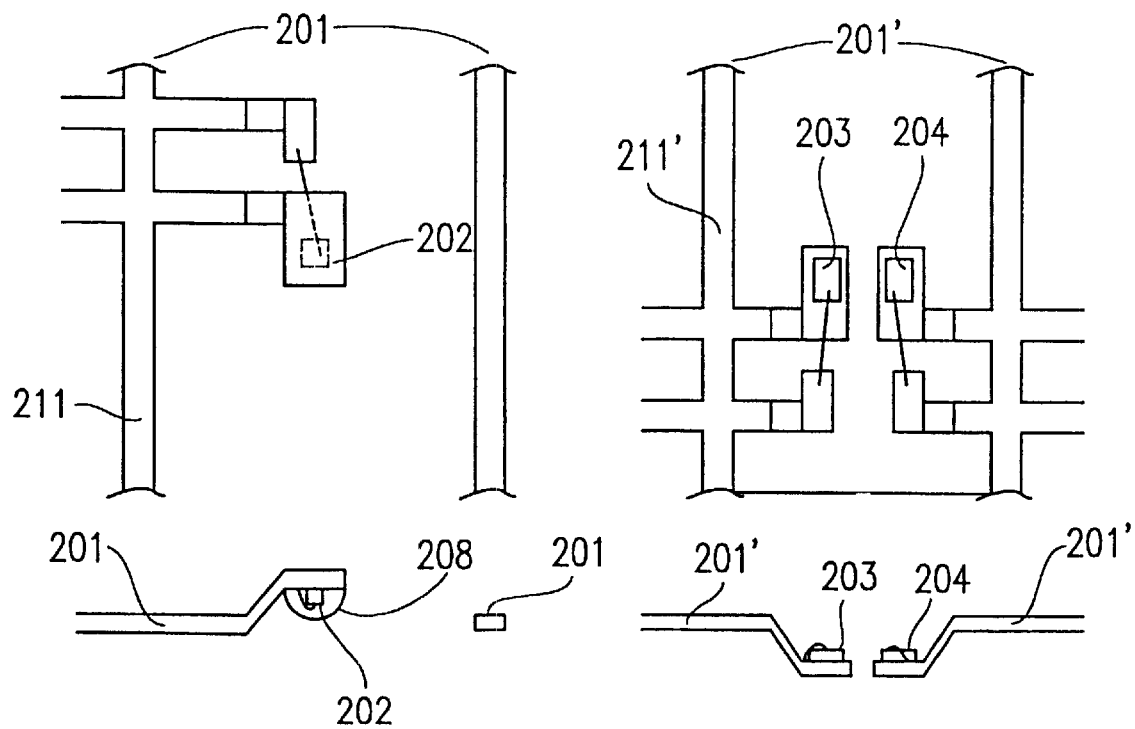
FIG. 19 shows another structure example of the conventional linear photocoupler.
Figure 20:
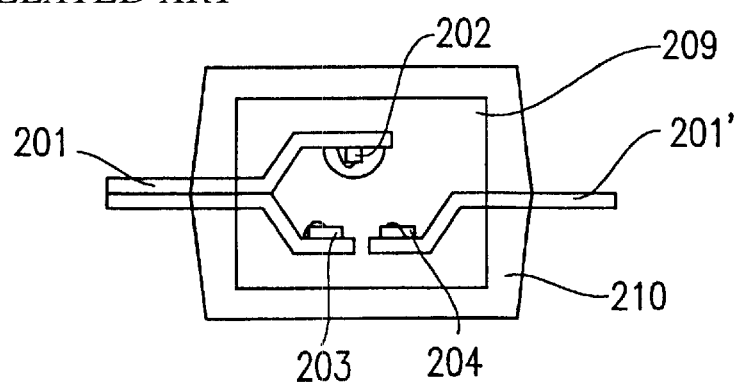
FIG. 20 is a cross-sectional view of the conventional linear photocoupler shown in FIG. 19.
Figure 21:
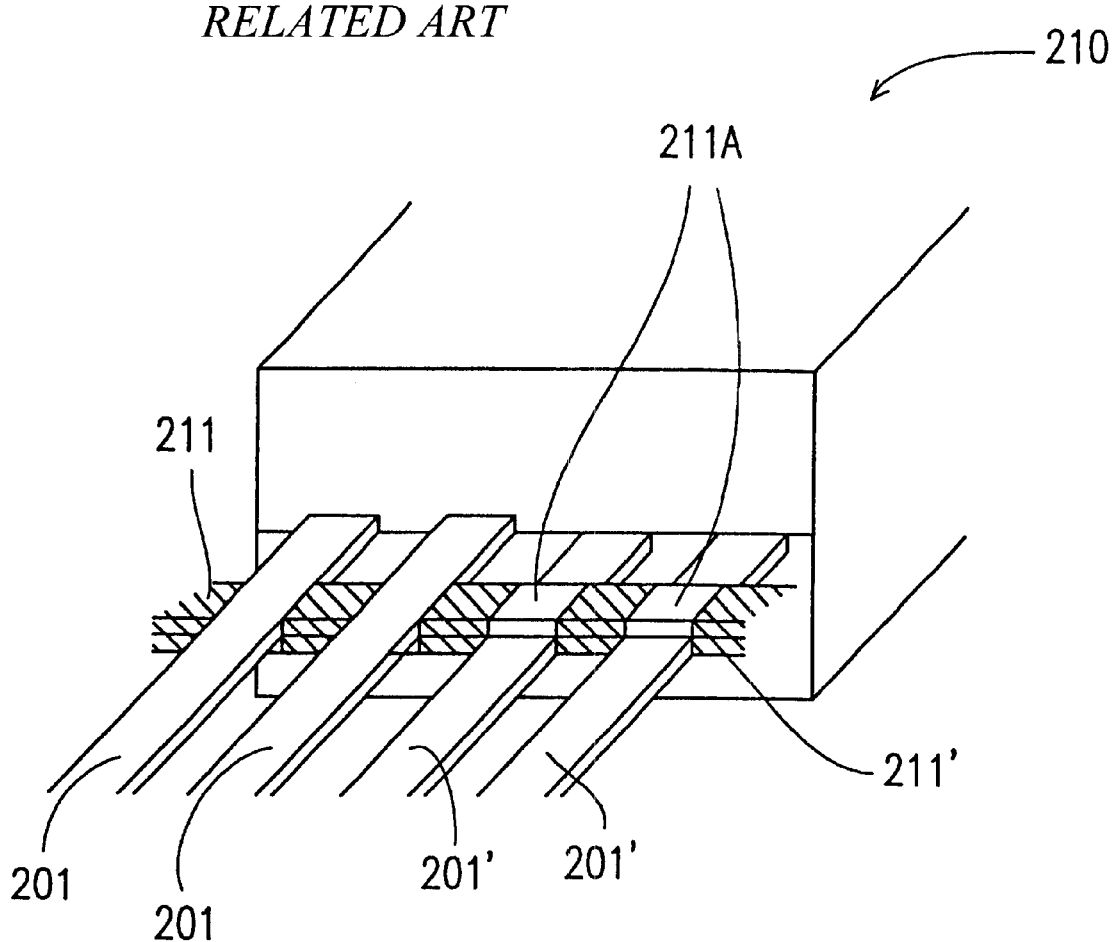
FIG. 21 is a perspective view of the conventional linear photocoupler.

FIG. 16 shows a structure of a photocoupler device using the lead frames 231 and 232. The primary and secondary side lead frames 231 and 232 are combined as described above, thereby forming two dual-channel type linear photocouplers, which are denoted by reference numerals 239 and 240.

As seen from the FIG. 16 in conjunction with FIGS. 13A, 13B, 14A, and 14B, when the primary and secondary side lead frames 231 and 232 are combined, a pair formed by the light emitting element 202 (on the header 212) and the monitor output element 203 (on the header 214) of the primary side lead frame 231, and the output element 204 (on the header 222) of the secondary side lead frame 232 constitute a channel 239A. The output element 204 (on the header 217) of the primary side lead frame 231, and a pair formed by the light emitting element 202 (on the header 218) and the monitor output element 203 (on the header 220) of the secondary side lead frame 232 constitute another channel 239B. The channels 239A and 239B may be covered with a light-transmissive resin (first molding process), and the molded structure may be further covered with a light-shielding resin (second molding process).

Thus, according to the present invention, light emitted by the light emitting element 202 is directly incident on the monitor output element 203 and the output element 204 in a uniform manner. In addition, unnecessary tie bars are not left on the leads. With a prototype of the photocoupler device of the present invention, the ratio of the output current between the monitor output element 203 and the output element 204 (K1/K2) is 0.9 (n=50), which is a satisfactory value for practical use.

Furthermore, a design in which the distance between the light emitting element and the output element is short, effectively increases the output current. Thus, the precoat of the transparent silicone resin on the monitor output element and the output element is also effective for increasing the output current as much as possible.

Although the dual-channel type linear photocoupler has been described in the present example, the present invention is also applicable to a single channel type linear photocoupler, as described above.

As described hereinabove, according to the photocoupler device the present invention, a light emitting element and an output photodetector are positioned so as to face each other. Thus, an optical path between the light emitting element and the output photodetector becomes linear, whereby light emitted by the light emitting element is directly incident on the output photodetector. As a result, effects of the optical path on optical signals are small. Furthermore, the optical path is linear and short, expensive silicone resin is not required for the formation of the optical path. Even if the silicone resin is used, a small amount of silicone resin is sufficient. Additionally, since the optical signal travels without using reflection, the optical signal is not likely to be affected by the external shape of the optical path. As a result, an output ratio between the monitor photodetector and the output photodetector is stabilized. Furthermore, the transmission efficiency of the optical signal from the light emitting element to each of the photodetectors does not vary even when the state of the reflection surface is varied due to a temperature change because the optical signal travels without using reflection. Furthermore, since the optical signal travels without using reflection, a light-shielding resin, e.g., a resin of black color, car be applied to the outermost surface of the photocoupler device in order to completely block interfering stray light from outside. As a result, the reliability of the photocoupler device is increased.

Furthermore, according to a method for fabricating a photocoupler device of the present invention, only a light emitting element is mounted on a first lead frame, while the monitor photodetector and the output photodetector are mounted on a second lead frame. The lead frames are combined so that the light emitting element and the monitor photodetector are provided on the primary side, and the output photodetector is provided on the secondary side. In such a structure, in each lead frame, the light emitting element and the photodetectors can be separately assembled. If assembly processes of the elements are concurrently conducted, the fabrication process can be simplified. After the lead frames are combined, the light emitting element and the monitor photodetector belong to the primary side, while the output photodetector belong to the secondary side. This arrangement causes no problem in practical use.

Furthermore, the lead frames of the present invention realize a linear photocoupler with characteristics and reliability superior to the prior art and requiring no special steps in the fabrication process thereof.

Consequently, a lead frame and a photocoupler device fabricated using the lead frame which have uniform characteristics and have no tie bar portion left on the lead when the lead frames are combined, can be provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A photocoupler device, comprising:
    a light emitting element;
    a monitor photodetector and an output photodetector for receiving light from the light emitting element;
    a primary side lead frame for mounting at least the light emitting element and the monitor photodetector; and
    a secondary side lead frame for mounting at least the output photodetector,
    wherein the light emitting element and the output photodetector are placed so as to face each other,
    the primary side lead frame includes a plurality of mounting portions provided in planes above and below the plane of the primary side lead frame, and
    the secondary side lead frame includes a plurality of mounting portions provided in planes above and below the plane of the secondary side lead frame.

2. A photocoupler device according to claim 1, wherein the monitor photodetector on the primary side lead frame and the output photodetector on the secondary side lead frame are provided on a same plane, and are positioned so as to face the light emitting element on the primary side lead frame.

3. A photocoupler device according to claim 1, wherein the monitor photodetector and the light emitting element on the primary side lead frame are provided on a same plane, and are positioned so as to face the output photodetector on the secondary side lead frame.

4. A photocoupler device according to claim 1, wherein the monitor photodetector and the light emitting element of the primary side lead frame are positioned at different levels, and face the output photodetector on the secondary side lead frame.

5. A photocoupler device according to claim 1, wherein the light emitting element, the monitor photodetector, and the output photodetector are covered with a light-transmissive resin through a first transfer molding process, and then, are further covered with a light-shielding resin through a second transfer molding process.

6. A photocoupler device according to claim 1, wherein the light emitting element and the monitor photodetector, or the light emitting element and the output photodetector are covered with a single transparent resin layer.

7. A photocoupler device according to claim 1, wherein at least one of the light emitting element, the monitor photodetector, and the output photodetector is precoated with a transparent resin layer.

8. A method for fabricating a photocoupler device including a light emitting element, and a monitor photodetector and an output photodetector for receiving light from the light emitting element, comprising steps of:
    providing a plurality of mounting portions on a first lead frame, said mounting portions being on planes above and below the plane of the first lead frame;
    providing a plurality of mounting portions on a second lead frame, said mounting portions being on planes above and below the plane of the second lead frame;
    mounting the light emitting element on the first lead frame;
    mounting the output photodetector and the monitor photodetector on the second lead frame; and
    combining the first lead frame and the second lead frame so that the light emitting element and the monitor photodetector are provided on a primary side, and the output photodetector is provided on a secondary side,
    wherein none of the mounting portions of the first and second lead frames, provided on the plane above the planes of their respective lead frames, overlap each other, and
    none of the mounting portions of the first and second lead frames, provided on the plane below the planes of their respective lead frames, overlap each other.

9. A lead frame for a photocoupler device, comprising:
    a primary side lead frame and a secondary side lead frame, wherein the primary side lead frame and the secondary side lead frame are combined together, and have a common reference plane,
    wherein the primary and secondary side lead frames each have a plurality of turned-up mounting portions extending upward with respect to the reference plane; and a plurality of turned-down mounting portions extending downward with respect to the reference plane; and
    wherein said mounting portions of said primary side lead frame are provided in planes above and below the common reference plane of the primary side lead frame; and
    wherein said mounting portions of said secondary side lead frame are provided in planes above and below the common reference plane of the secondary side lead frame; and
    one of the turned-up mounting portions does not extend over any other turned-up mounting portion, and one of the turned-down mounting portions does not extend below any other turned-down mounting portion.

10. A lead frame for a photocoupler device according to claim 9, wherein
    element-pairs of a light emitting element and a monitor output element, and output elements are provided one after another on each of the primary and secondary side lead frames; and
    the primary and secondary side lead frames are assembled so that one of the element-pairs provided on the primary side lead frame faces corresponding one of the output elements provided on the secondary side lead frame, and one of the element-pairs provided on the secondary side lead frame faces corresponding one of the output elements provided on the primary side lead frame.

11. A photocoupler device, comprising:
a light emitting element;
a monitor output element;
an output element; and
a primary side lead frame and a secondary side lead frame having a common reference plane,
wherein the primary and secondary side lead frames each have a plurality of element mounting portions for alternately mounting the light emitting element, the monitor output element, and the output element, wherein some of the plurality of element mounting portions extend upward and others extend downward with respect to the reference plane, and wherein one of the element mounting portions extending upward does not extend over any other element mounting portion extending upward, and one of the element mounting portions extending downward does not extend below any other element mounting portion extending downward, and the primary and secondary side lead frames are assembled so that one of pairs of the light emitting element and the monitor output element provided on the primary side lead frame faces corresponding one of the output elements provided on the secondary side lead frame, and one of pairs of the light emitting element and the monitor output element provided on the secondary side lead frame faces corresponding one of the output elements provided on the primary side lead frame.

* * * * *